United States Patent [19]

Weaver et al.

[11] Patent Number: 4,901,120

[45] Date of Patent: Feb. 13, 1990

[54] STRUCTURE FOR FAST-RECOVERY BIPOLAR DEVICES

[75] Inventors: Carson E. Weaver, Tewksbury; Philip L. Hower, Concord, both of Mass.

[73] Assignee: Unitrode Corporation, Lexington, Mass.

[21] Appl. No.: 61,189

[22] Filed: Jun. 10, 1987

[51] Int. Cl.$^4$ .............................................. H01L 29/48
[52] U.S. Cl. ........................................ 357/15; 357/34; 357/45; 357/43; 357/52; 357/36
[58] Field of Search ....................... 357/15, 34, 45, 43, 357/52, 52 D, 36, 15 R, 15 M, 15 P

[56] References Cited

U.S. PATENT DOCUMENTS

| | | | |
|---|---|---|---|
| 4,253,105 | 2/1981 | Olmstead et al. | 357/15 |
| 4,370,670 | 1/1983 | Nawata et al. | 357/36 |
| 4,405,934 | 9/1983 | Sloan | 357/15 |
| 4,536,945 | 8/1985 | Gray et al. | 357/15 |
| 4,641,174 | 2/1987 | Baliga | 357/15 |
| 4,691,223 | 9/1987 | Murakami et al. | 357/34 |

OTHER PUBLICATIONS

Shimizu et al., "High-Speed Low-Loss p-n Diode Having a Channel Structure," *IEEE Transactions on Electron Devices*, vol. ED-31, No. 9, Sep. 1984, pp. 1314–1319.

Amemiya et al., "Novel Low-Loss and High-Speed Diode Utilizing an 'Ideal' Ohmic Contact," *IEEE Transactions on Electron Devices*, vol. ED-29, No. 2, Feb. 1982, pp. 236–243.

Zeidenbergs, *IBM Technical Disclosure Bulletin*, vol. 14, No. 4, Sep. 1971, p. 1104, "Multiemitter Schottky Barrier Transistor with Negligible Emitter-to-Emitter Gain".

Brill et al., "Power Transistor with Reduced Minority Carrier Storage," *IBM Technical Disclosure Bulletin*, vol. 19, No. 10, Mar. 1977, pp. 3787–3788.

Baliga, "The Pinch Rectifier: A Low-Forward-Drop High-Speed Power Diode," *IEEE Electron Device Letters*, vol. EDL-5, No. 6, Jun. 1984, pp. 194–196.

Hower et al., "Schottky Rectifiers for Low-Voltage Outputs," APEC Meeting, New Orleans, Apr. 1986, Unitrode Corp., Watertown, MA., pp. 1–10.

*Primary Examiner*—William A. Mintel
*Attorney, Agent, or Firm*—Weingarten, Schurgin, Gagnebin & Hayes

[57] ABSTRACT

A bipolar junction structure comprising a Schottky barrier rectifying contact juxtaposed to a p-n junction having the distribution of p+ diffusions common to a guard ring structure on the Schottky barrier area.

9 Claims, 5 Drawing Sheets

STRUCTURE FOR FAST-RECOVERY BIPOLAR DEVICES

FIELD OF THE INVENTION

The present invention relates to bipolar junction semiconductor devices and, in particular, to fast-recovery bipolar junction devices and circuits.

BACKGROUND OF THE INVENTION

In bipolar junction semiconductor devices, such as a diode or transistor, it may be desirable to exhibit a fast recovery from the application of a reverse bias voltage. The usual approach to the construction of a fast recovery bipolar junction device is to select the EPI doping and thickness to accommodate the desired reverse breakdown voltage. Recombination centers are added to the structure to provide for the removal of minority carriers so as to reduce the reverse recovery time ($t_{rr}$). This construction typically utilizes gold or platinum diffusion and electron irradiation. Gold diffusion has the disadvantage of increasing the device leakage current. For both platinum and gold, processing uncertainties can give poor control of the reverse recovery time. Another approach to reduce the recovery time is the use of a rectifying contact in the junction construction exemplified by the Schottky barrier shown in FIG. 1. However, such construction exhibits an increased forward voltage at high current densities.

Another technique for reducing storage time is with a Baker clamp circuit shown in FIG. 2. However, the transistor on-state voltage $V_{CE}$ is the sum of $V_{BE}$ and $V_F$ (diodes), typically on the order of 1.4 volts.

It is desirable to fabricate fast-recovery devices without resorting to gold or platinum diffusion or recombination center construction. It is also desirable to avoid additional circuit components and/or junctions necessary for the Baker clamp. A construction method for a fast-recovery device having both a low forward voltage and a low reverse recovery time while handling high currents would be of significant value.

SUMMARY OF THE INVENTION

The present invention comprises a unique structure, which combines a p-n junction alongside a Schottky barrier rectifying contact fabricated at the bipolar junction of interest and comprises the distribution of the p+ diffusions common to a guard-ring structure over the entire Schottky barrier area. A grid of p+ material thereby encloses a cellular disposition of Schottky barriers. The p-n junction at the grid allows the device to exhibit a low forward voltage; the Schottky cell acts as a recombination zone and reduces minority carrier storage. The increase in forward voltage typical of a Schottky barrier at high current density, an effect common to conventional Schottky devices, is also prevented.

The present invention provides a bipolar junction structure which recovers rapidly from a reverse bias condition and which exhibits a reproducible reverse recovery time and a low forward voltage.

These characteristics and benefits are achieved without compromising, as in conventional devices, recovery time for a lower forward voltage, and without relying upon a diffusion of gold or platinum for the establishment of recombination centers.

BRIEF DESCRIPTION OF THE DRAWING

The invention will be more fully understood from the following detailed description taken in conjunction with the accompanying drawing, wherein.

DETAILED DESCRIPTION OF THE INVENTION

Figure 1:
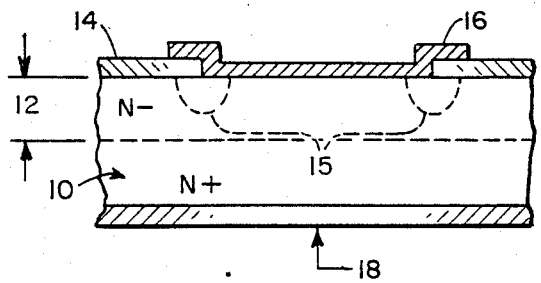
FIG. 1 is a cross-sectional view of a prior art Schottky barrier rectifier construction.

The construction of a conventional Schottky barrier device, Particularly a power rectifier, as formed by existing silicon photolithographic and diffusion techniques is exemplified in FIG. 1. The heavily-doped n-type donor material 10 has a lightly doped n-epitaxial layer 12. These semiconductor regions lie between an insulator layer 14, commonly formed from silicon dioxide, and an ohmic contact layer of conductive metal 18. The insulator layer 14 is sectioned to receive a Schottky barrier metal 16 which acts as a rectifying contact with the n-epitaxial layer 12. The abutment of the metal and the semiconductor creates a barrier effect at the rectifying contact. Majority carrier electrons from the n-epitaxial layer 12 pass easily into the metal 16, however, minority carrier flow is restricted. The structure thereby allows only a negligible storage of minority carriers at the barrier. Because the reverse recovery time ($t_{rr}$) of a semiconductor device is spent in the removal of minority carriers from the junction after the transition of an applied voltage from a forward-bias to reverse-bias state, a device having a Schottky barrier construction is capable of a low $t_{rr}$.

Figure 3:
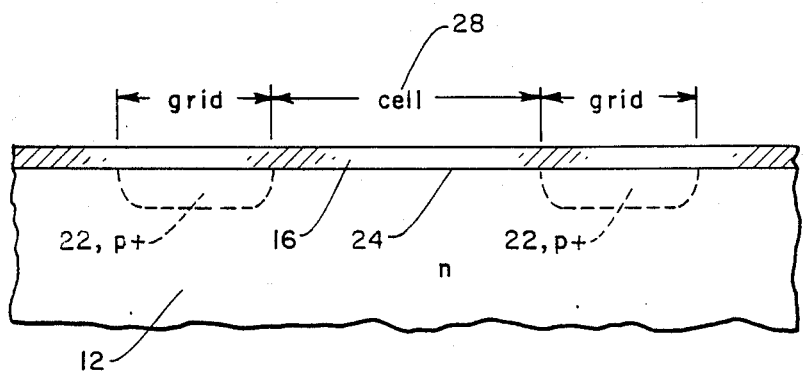
FIG. 3 is a cross-sectional view of the monolithic construction of a Schottky barrier in a bipolar junction according to the present invention.

The method of achieving fast recovery performance without the use of recombination centers according to the invention is shown in FIG. 3. The p+ diffusions, distinguishable from conventional devices which are commonly integrated during the guard ring 15 of the FIG. 1 diffusion step, are distributed over the entire rectifier area. A continuous grid-like distribution of p+ material 22 thereby underlies the Schottky barrier metal 16 and each deposit 22 interrupts the surrounding n-type epitaxial layer 12. The distribution of deposits 22, each separated by a cell 28 having a Schottky barrier 24, forms a grid of alternating deposits 22 and Schottky barrier cells 28.

Figure 4:
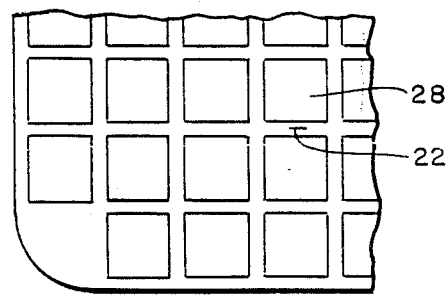
FIG. 4 is a top view of the structure of FIG. 3.

Viewed from above, as in FIG. 4, the arrangement of cells 28 within a grid 22 of p+ material appears as a lattice. The distribution of cell area per grid area is proportioned to achieve significant improvement in several parameters of device performance. During forward bias, carrier injection from the grid 22 achieves a low resistivity in the layer 12 due to conductivity modulation. During turn-off, the cell 28 acts as a recombination sink by aiding the removal of injected minority carriers during the recovery phase and thereby acts as a plane of recombination centers. Within the cell there is greatly reduced minority carrier storage.

The preferred embodiment has a cell-to-grid area ratio of approximately 1:1. However, the inclusion of even a relatively small grid area can reduce the typical forward voltage value for the common Schottky device. The number of cells are varied according to Table 1.

TABLE I

Relative Areas for Various Patterns with a p+ Grid and Schottky Cells

| Pattern No. | Cell Size | p+ Area | Schottky Area |
|---|---|---|---|
| 1 | 167 mils | 5% | 95% |
| 2 | 26 mils | 17% | 83% |
| 3 | 10 mils | 33% | 67% |
| 4 | 5 mils | 50% | 50% |

Figure 5:
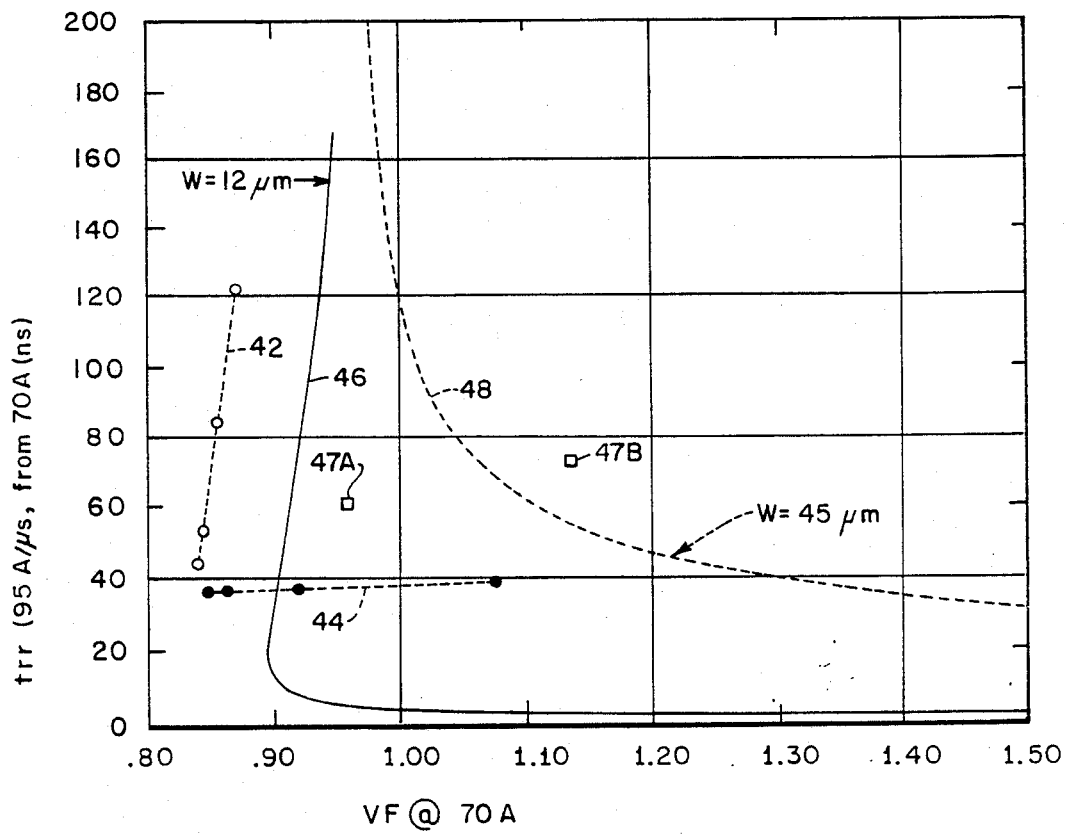
FIG. 5 is a plot representing the reverse recovery time as a function of forward voltage of several embodiments of the invention.

The performance ratio of reverse recovery time per forward voltage for configurations of the invention may be seen in FIG. 5. A reduction in $t_{rr}$ with a concurrent reduction in $V_F$ is indicated by a sequence of points 44 and 42 moving to the lower left corner of the graph 40 representing the effect of a p+ grid with Schottky cells 44 or a Schottky grid with p+ cells 42. For comparison to the invention, FIG. 5 features the calculated best-performance curves for a conventional p-n junction device having an n-base layer thickness of either 12 micrometers or 45 micrometers in curves 46 and 48, respectively.

The $t_{rr}$ to $V_f$ ratios, if taken from typical gold- or platinum-doped rectifiers, would lie to the right of the best-performance curves 46 and 48. For example, data points 47A and 47B taken from two high-efficiency power rectifiers (UES 803 and UES 806) representative of the current art appear to the right of curves 46. The points 47A and 47B also reflect how common design practice compromises $t_{rr}$ with low forward voltage, or vice versa.

The $t_{rr}$ per $V_F$ data points in FIG. 5 are taken from the operation of several versions of diodes constructed according to the invention. The majority of the data points on curves 42 and 44 lie to the left of the conventional device best-Performance curves, thereby indicating that the invention achieves a major improvement over the typical $t_{rr}$ per $V_F$ performance ratios of conventional devices. The positions of these data points also indicate no compromise in the achievement of low $t_{rr}$ and $V_F$ values The two lower-leftmost data points represent the actual performance of the preferred embodiment, which utilizes a cell-to-grid area ratio of 1:1. In sum, none of the inventive embodiments use gold or platinum doping, yet they demonstrate superior performance without the problems attributable to recombination-center doping.

Figure 6:
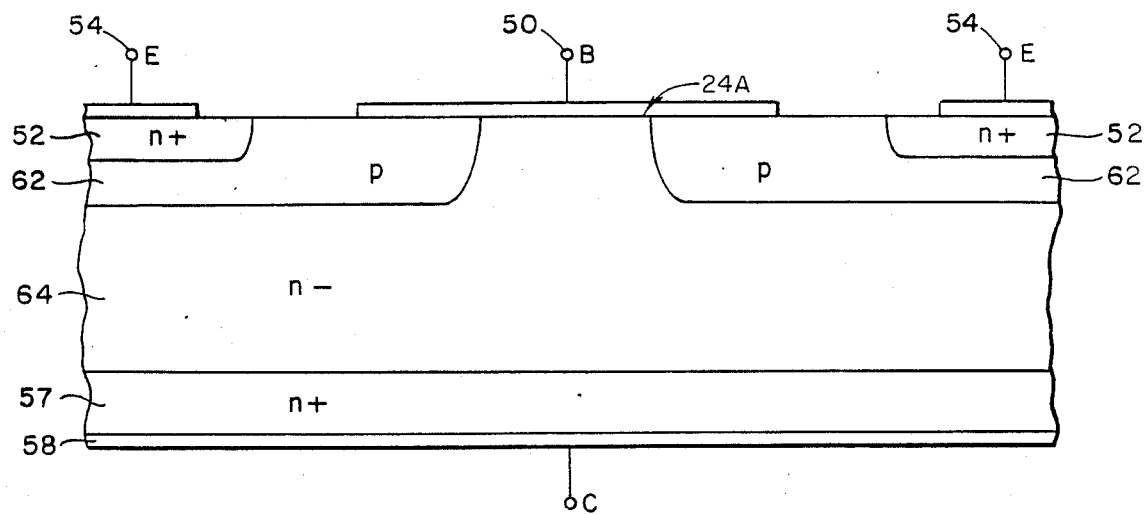
FIG. 6 is a cross-sectional view of an alternate embodiment of the invention as applied to the p-n junction of a high-voltage bipolar transistor.

A method of incorporating the invention in a high-voltage transistor junction is shown in an alternate embodiment of FIG. 6. The p-type base region 62 is terminated to permit a Schottky barrier 24A between the base contact 50 and the n− collector layer 64. Diffused over the base layer 62 is an n+ layer 52 which underlies the emitter contact 54. An n+ layer 57 separates the collector contact 58 and the n−collector layer 64. The spacing between adjacent p layers 62 is small enough to eject a pinch-off of the depletion regions therein well before the onset of the collector-base junction voltage breakdown. By this "clamping" of the emitter to the collector, there will be little storage of minority carriers under the Schottky contact. Also, the Schottky contact will act as a recombination site for holes stored under the p-type base material 62.

Figure 2:
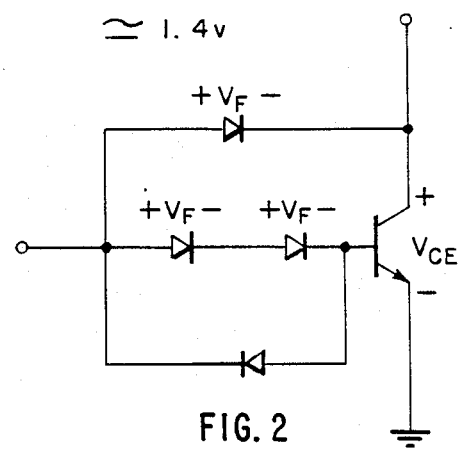
FIG. 2 is a schematic of a prior art Baker clamp circuit for reducing storage time.
Figure 7:
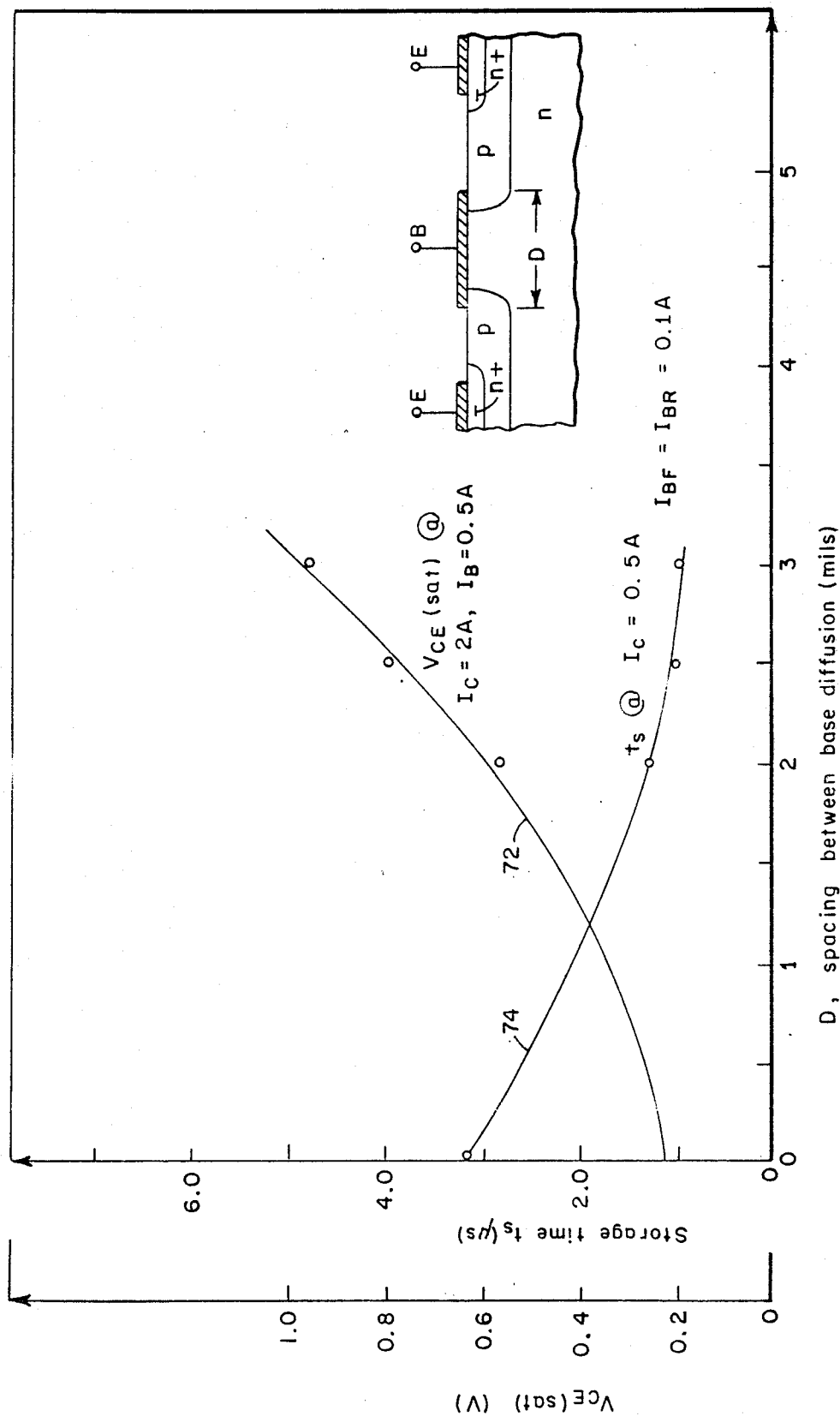
FIG. 7 is a plot representing the storage time and $V_{CE}$(sat) as a function of base diffusion spacing.

As shown in FIG. 7, the device constructed according to the present invention has typical and typical $V_{CE}$(sat $t_s$ characteristics 72 and 74 in FIG. 7. This figure shows that the storage time decreases monotonically with base diffusion spacing, D. The corresponding increase in $V_{CE}$(sat) is still less than that found in the prior art, such as the Baker clamp of FIG. 2.

Figure 8:
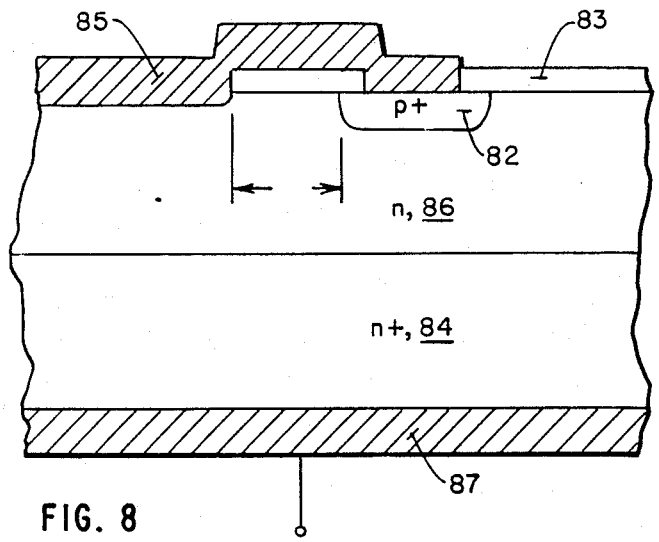
FIG. 8 is a cross-sectional view of an alternate embodiment of the present invention having a Schottky barrier contact separated from the second p-n junction less than three (3) minority carrier diffusion lengths.

FIG. 8 shows a second alternate embodiment of the present invention which provides a bipolar junction structure including a p-n junction formed from a p+ diffusion region 82 and an n-type substrate 84 having an n epitaxial layer 86 and a metalized cathode terminal 87. A silicon oxide insulator or dielectric layer 83 is provided over the n epitaxial layer 86, and a separate silicon oxide layer 81 is provided over a portion of the p+ diffusion region 82. A metalization layer 85 is applied over the p+ diffusion region 82 and the silicon oxide insulation layer 81 of less than three (3) minority carrier diffusion lengths in dimension Lx to provide a Schottky barrier according to the present invention.

Figure 9:
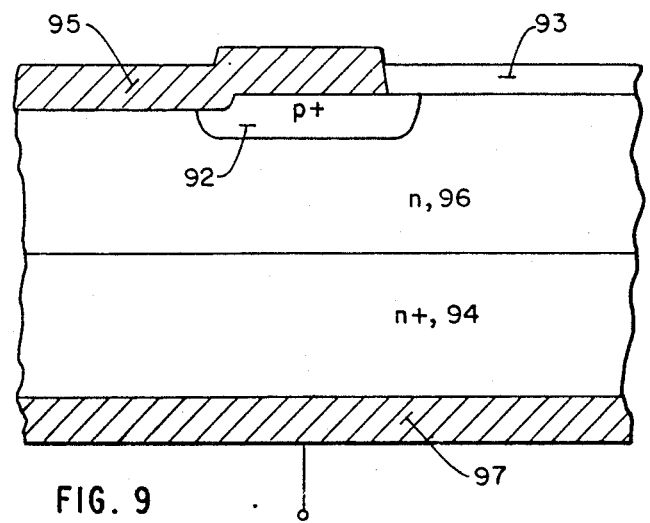
FIG. 9 is a cross-sectional view of a third alternate embodiment of the present invention having a Schottky barrier contact overlaying a portion of said p-n junction.

A third alternative embodiment of the present invention is shown in FIG. 9, which provides a bipolar junction structure including a p-n junction formed from a p+ diffusion region 92 in an n-type substrate 94 having an n epitaxial layer 96 and a metalized cathode terminal 97. A Schottky barrier junction is formed by a metalization layer 95 overlying a portion of the p+ diffusion region, including the p+ junction with the n epitaxial layer 96. An insulating layer 93, comprising a silicon oxide or other dielectric material is provided over a portion of the p+ diffusion region and the remaining of the n epitaxial layer 96.

Figure 10:
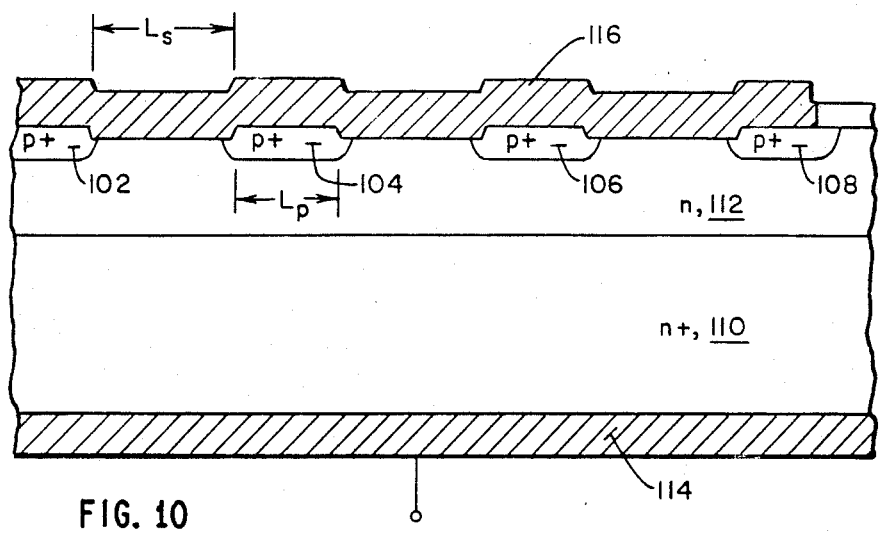
FIG. 10 is a cross-sectional view of a fourth alternate embodiment of the present invention having a plurality of isolated p+ diffusion regions in common with a common Schottky barrier contact.
Figure 11:
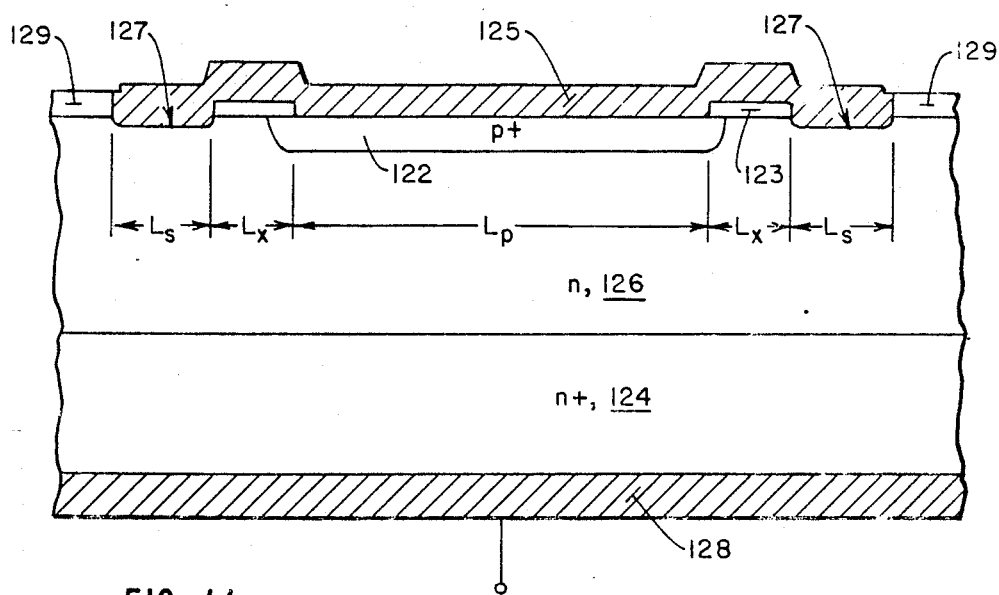
FIG. 11 is a cross-sectional view of a fifth alternate embodiment according to the present invention showing a relationship of the transverse dimensions of the p-n junction and the Schottky barrier contact within the range of 95:5.

A fourth alternative embodiment according to the present invention is shown in FIG. 10, which provides a bipolar junction structure including a p-n junction formed from a plurality of isolated p+ diffusion regions 102, 104, 106, and 108 in an n-type epitaxial layer 112 having an n-type substrate 110 and a metalized cathode terminal 114. A Schottky barrier contact in contact with each of the plurality of isolated p+ diffusion regions 102, 104, 106, and 108 is provided by a metalization layer 116 which overlies at least a portion of the p+ diffusion regions and the n epitaxial layer 112. This embodiment of the present invention envisions a spacing Ls between the p+ diffusion regions of less than three (3) minority carrier diffusion lengths, and a width Lp of the p+ diffusion regions of less than three (3) minority carrier diffusion lengths. Furthermore, the proportion of the spacing between the diffusion regions and the widths of the diffusion regions may be varied over a wide ratio including 5:95 to 95:5.

A fifth alternate embodiment of the present invention provides a bipolar junction structure including a p-n junction formed from a p+ diffusion region 122 of dimension Lp in an n-type substrate 124 having an n type epitaxial layer 126 and a metalized cathode terminal 128. A silicon oxide insulator or dielectric material 123 of dimension Lx is disposed about the periphery of the p+ diffusion region in contact with the n epitaxial layer 126. A metalization layer 125 overlays the p+ diffusion region, the silicon oxide insulating layer 123, forming Schottky barrier junction on the n epitaxial layer 126 at regions 127 having a dimension Ls. The remaining outward separated portion of the n epitaxial layer 126 is covered with a silicon oxide insulator or dielectric material 129. The preferred smallest transverse dimension Lx of the insulative layer 123 is less than three (3) minority carrier diffusion lengths, while the ratio of the width of the p+ diffusion region 122 to the width of the Schottky barrier region 127 (Lp:Ls) is preferably less than 95:5.

Alternate embodiments, substitutions and engineering changes made by one skilled in the art are considered to be within the scope of the present invention, which is not to be limited except by the claims which follow.

What is claimed is:

1. A rectifying semiconductor device providing increased minority carrier recombination during the recovery phase of the operation of said device, comprising:
    a p-N junction formed from a P+ diffusion region having a grid-like pattern in an N-type substrate; and
    a metalization layer in contact with said P+ diffusion region and said substrate, forming an array of Schottky barrier rectifying contact cells, wherein each of said cells is bounded by said P+ diffusion region.

2. The rectifying semiconductor device of claim I wherein the area of said P+ diffusion region is substantially equal to the aggregate cell area.

3. A rectifying semiconductor device providing increased minority carrier recombination during the recovery phase of the operation of said device, including:
    a plurality of P-N junctions formed from a plurality of non-contiguous P+ diffusion regions in an N-type substrate; and
    a metalization layer in contact with each of said non-contiguous P+ diffusion regions, and in contact with said N-type substrate, to form a continuous Schottky barrier contact with other than said P+ diffusion regions.

4. The rectifying semiconductor device of claim 3 wherein the distance between each nearest neighboring pair of said P-N junctions is less than three (30 minority carrier diffusion lengths.

5. The rectifying semiconductor device of claim 4 wherein the ratio of the width of the P+ diffusion region to the Schottky barrier therebetween is in the range of 95:5 to 5:95.

6. A rectifying semiconductor device providing increased minority carrier recombination during the recovery phase of the operation of said device, comprising:
    a P-N junction formed from a P+ diffusion region in an N-type substrate;
    a metalization layer in contact with said P+ diffusion region and said N-type substrate to form a Schottky barrier contact; and
    an insulating region disposed about the periphery of the P+ diffusion region and in contact with said P+ diffusion region and said N-type substrate;
    wherein said Schottky barrier contact is disposed within three minority carrier diffusion lengths of said P-N junction, and wherein the ratio of the width of said P+ diffusion region to the width of said Schottky barrier contact is no greater than 95:5.

7. The rectifying semiconductor device of claim 1, wherein said P+ diffusion region has a surface that is substantially coplanar with a surface of said N-type substrate, said metalization layer contacting said coplanar surfaces.

8. The rectifying semiconductor device of claim 3 wherein the distance between a nearest neighboring pair of said P-N junctions is less than three (3) minority carrier diffusion lengths.

9. The rectifying semiconductor device of claim 3 further comprising an insulating region disposed about the periphery of each of said P+ diffusion regions and in contact with the P+ diffusion region and said N-type substrate.

* * * * *

UNITED STATES PATENT AND TRADEMARK OFFICE
CERTIFICATE OF CORRECTION

PATENT NO. : 4,901,120

DATED : February 13, 1990

INVENTOR(S) : Carson E. Weaver and Philip L. Hower

It is certified that error appears in the above-identified patent and that said Letters Patent is hereby corrected as shown below:

In Column 2, line 43, "Particularly" should read --particularly--.

In Column 3, line 60, "best-Performance" should read --best-performance--.

In Column 4, line 13, "eject" should read --effect--.

In Column 4, line 21-22, "and typical $V_{CE}$(sat $t_s$ characteristics" should read --$V_{CE}$(sat) and $t_s$ characteristics--.

In Column 5, line 44, "claim I" should read --claim 1--.

In Column 6, line 11, "three (30 minority" should read --three (3) minority--.

Signed and Sealed this

Fourteenth Day of July, 1992

*Attest:*

DOUGLAS B. COMER

*Attesting Officer*   *Acting Commissioner of Patents and Trademarks*